United States Patent [19]

Sasago et al.

[11] Patent Number: 4,805,002
[45] Date of Patent: Feb. 14, 1989

[54] EXPOSURE APPARATUS

[75] Inventors: Masaru Sasago, Hirakata; Masayuki Endo, Izumi; Kazufumi Ogawa, Hirakata; Takeshi Ishihara, Neyagawa, all of Japan

[73] Assignee: Matsushita Electric Industrial Co. Ltd., Osaka, Japan

[21] Appl. No.: 61,263

[22] Filed: Jun. 12, 1987

[30] Foreign Application Priority Data

Jun. 13, 1986 [JP] Japan ................................ 61-138556
Jun. 20, 1986 [JP] Japan ................................ 61-145153

[51] Int. Cl.⁴ ..................... G03B 27/54; G03B 27/42
[52] U.S. Cl. ........................................ 355/67; 355/43; 355/53
[58] Field of Search ............... 355/50, 53, 67, 43, 355/45; 350/432, 443, 505

[56] References Cited

U.S. PATENT DOCUMENTS

| | | | |
|---|---|---|---|
| 4,095,891 | 6/1978 | Lovering | 355/50 |
| 4,572,659 | 2/1986 | Omata | 355/67 |
| 4,577,959 | 3/1986 | Yazaki | 355/53 X |
| 4,653,903 | 3/1987 | Torigoe et al. | 355/53 |

*Primary Examiner*—Richard A. Wintercorn
*Attorney, Agent, or Firm*—Wenderoth, Lind & Ponack

[57] ABSTRACT

A reduction projection exposure apparatus includes an excimer laser beam source, and a concave spherical mirror disposed in the optical path between the light source optical system and a reticle, so as to minimize the overall height of the optical system (in particular, the reduction projection exposure apparatus) and to increase the degree of freedom of optical design. The apparatus is more than 25% shorter than the conventional apparatus, and a high degree of freedom is obtained in the optical design.

6 Claims, 4 Drawing Sheets

EXPOSURE APPARATUS

BACKGROUND OF THE INVENTION

This invention relates to an exposure apparatus, and more particularly, to an exposure apparatus employing photolithiographic technology in the fabrication of semiconductor devices.

More specifically, this invention relates to a projection exposure apparatus having a reduction lens system devised to realize ultrafine processing in a photolithographic process used in the fabrication of semiconductor devices, and especailly to a reduction projection exposure apparatus using a discontinuous (for example, pulsive) energy beam, and even more specifically, to an exposure apparatus using an excimer laser.

At present, various reduction projection exposure apparatuses (steppers) are commercially available, using a superhigh pressure mercury lamp as the light source for facilitating ultrafine processing of semiconductor devices, especially LSI and VLSI. In the existing steppers, however, since the g-line (436 nm) and i-line (365 nm) of the light emitted by the superhigh pressure mercury lamp are used, the resolution is limited to 0.8 $\mu$m for the g-line and to 0.6 $\mu$m for the i-line. At these wavelengths, it is next to impossible to obtain a resolution of 0.5 $\mu$m required in the manufacture of 4M and 16M bit devices.

Recently, in this area, it has been considered to modify the exposure apparatuses by using excimer laser light sources, such as XeCl (308 nm), KrF (249 nm) and ArF (193 nm), which emit light having a shorter wavelength than the g-line or i-line.

But the following problems are involved in the reduction projection exposure technology using an excimer laser.

(1) Because the exposure wavelength is short, the selection of material for optical material glass (vitreous material) used in the reduction projection lens is limited in relation to the transmission factor. For example, materials used in the lens for the laser wavelength of KrF (249 nm) and of ArF (193 nm) are limited to only $SiO_2$ and $CaF_2$. Therefore, with respect to the reduction projection lens design, it is required to correct chromatic aberration and to make other corrections in the unit in the order of one of several fractions of the wavelength by making use of the slight difference between the refractive index and dispersion of the glass material which will compose the lens. However, with the far ultraviolet rays of an excimer laser beam, since the usable materials are limited, it is only possible to shift radius of the curvature of the spherical material having the same refractive index by slight portions when designing of the reduction projection lens, which may result in an extreme length of about 1 meter only for the reduction projection lens.

If the reduction projection lens is this long, it is very difficult to reduce the quantity of light by shortening the optical path difference in the optical system to illuminate the reduction projection lens system and to design with an ample degree of freedom.

(2) On the other hand, reduction projection exposure apparatus not limited to the excimer laser, and installed in a superhigh performance clean room, its volume and ... must be minimized due to the restrictions of the ... But if said lens is used in the general optical ... the reduction projection exposure apparatus, ... nent shown in FIG. 5 will result. The light emitted from an excimer laser light source 1 passes through an integrator 2 and then from a flat plate refraction mirror 8 to an illumination optical system 7 having a vertical condenser lens for focusing and the light and then to a lens 5 over a distance $l_3$ of nearly 1 meter, and the reticle 4 is uniformly illuminated, and the light is transmitted to the wafer semiconductor substrate 6 by way of a long reduction projection lens 5 having a lens length $l_1$ of about 1 meter.

Therefore, in the conventional apparatus shown in FIG. 5, an illumination optical system 7 is required, and the length of $l_1 + l_3$ is as long as 2 meters, and the height of the apparatus itself is taller than 2 meters, so that the deviation of optical axis and other troubles are very likely to occur in the superhigh precision exposure apparatus forming patterns of about 0.5 $\mu$m. And when the height is further increased, the design difficulties become more severe due to the problems of vibration and other problems, and this height problem is particularly serious in the excimer light source 1 which generates vibration noise upon every oscillation. Furthermore, it is extremely difficult to dispose the optical system of alignment line between the wafer 6 and the reticle 4. Finally, due to the extreme height of the apparatus, it is difficult to install the same in a superhigh performance clean room.

A sectional view of a conventional reduction projection exposure apparatus is shown in further detail in FIG. 6. An excimer laser light source 1 is secured to a stepper main body 12, and the laser beam emitted from the light source is reflected by a small reflection mirror 9, and is further reflected at a right angle by a large reflection mirror 8. In succession, the laser beam is focused by a condenser lens 7 onto the pupil of a lens 5, and an image is formed on a wafer 6 on an XYZ stage 6a through reticle 4 and lens 5. The main body is mounted on a quakeproof table 13. Numeral 11 designates power source and 10 designates a cable.

SUMMARY OF THE INVENTION

It is hence a primary object of this invention, which relates to an exposure apparatus using excimer reduction projection exposure technology or the like, to minimize the height of the entire optical system, more specifically, the reduction projection exposure apparatus, and to increase the degree of freedom of optical designing, by disposing a concave spherical or flat reflection mirror in the optical path between the optical system comprising, for example, the laser beam source, and the reticle.

That is, the element disposed along the optical path are as follows: an optical system such as an excimer laser as the light generation source, an integrator system for maintaining the uniformity of laser beam and for shaping the beam, and a concave spherical reflection mirror (for varying the direction of the optical path) instead of the conventional mirror and illumination optical system are disposed in the optical path between said reticle and said excimer laser light source to replace the condenser lens used in the conventional illumination optical system. Or, in another embodiment, the apparatus includes an excimer laser optical system as light generation source, an integrator system for maintaining the uniformity of the laser beam and for shaping the beam, an illumination optical system, and a flat reflection mirror disposed in the optical path between said reticle and illumination optical system. Furthermore, preferably, the reflection plane of the concave spherical mirror is composed of a multilayer film made of aluminum film and dielectric film exhibiting high reflectivity.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

Figure 1:
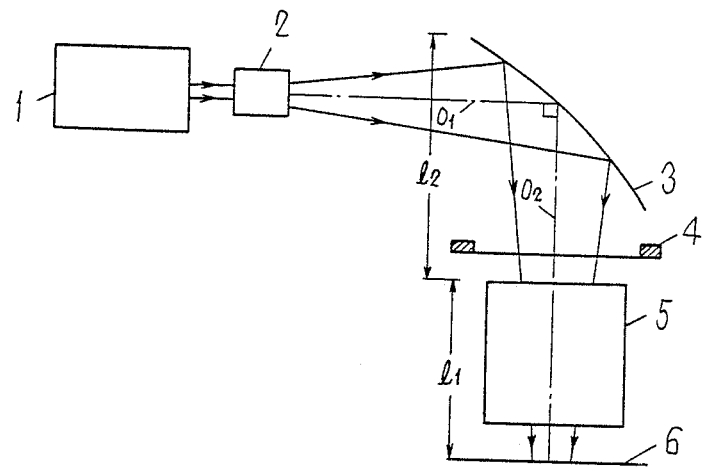
FIG. 1 is a schematic structural drawing of an essential part of an excimer exposure apparatus according to one of the embodiments of this invention.

Referring now to FIG. 1, a first embodiment of this invention is described below. As the light source, for example, a KrF excimer laser light source (oscillation wavelength 249 nm) 1 is used, and the light oscillated, excited and emitted from this light source 1 is shaped and made uniform by an integrator 2. This integrator 2 enlarges the beam diameter and transmits the light. In addition, a concave spherical mirror 3 capable of irradiating the effective region of the reticle 4 and having a radius of curvature that will reflect the light onto the incident pupil of the reduction projection lens 5 is disposed in the optical path between the integrator 2 and reticle 4. Through the lens 5, the pattern of the reticle 4 is emitted to the wafer (semiconductor substrate) 6 on which a resist is formed to be exposed. In this embodiment, the mirror 3 is disposed so that the optical axes $O_1$, $O_2$ form a right angle, but by varying the curvature of the concave spherical mirror 3, the length of optical axis $O_1+O_2$ may be set freely.

The reflection plane of the concave spherical mirror 3 is coated with a multilayer film composed of aluminum film and dielectric film high reflectivity so as to improve the reflectivity. In this condition, the efficiency of reflectivity is more than 99%.

In the optical system shown in FIG. 1, since the conventional condenser lens can be omitted, the apparatus height $l_1+l_2$ can be relatively low, or about 1.5 meters.

When the overall height of the apparatus $l_1+l_2$ is relatively low, the deviation of the optical axis $O_2$ due to vibration is inhibited, and it will exhibit extremely high performance when used as an exposure apparatus of the submicron pattern type. When exposing an ultrafine pattern of about 0.5 μm on the resist on the wafer 6, the resolution is deteriorated if the optical axis $O_2$ is deviated by only about several microns. Therefore, a reduction in the apparatus height by scores of centimeters is extremely useful in facilitating the formation of an ultrafine exposure pattern because the optical axis is hardly deviated.

Figure 2:
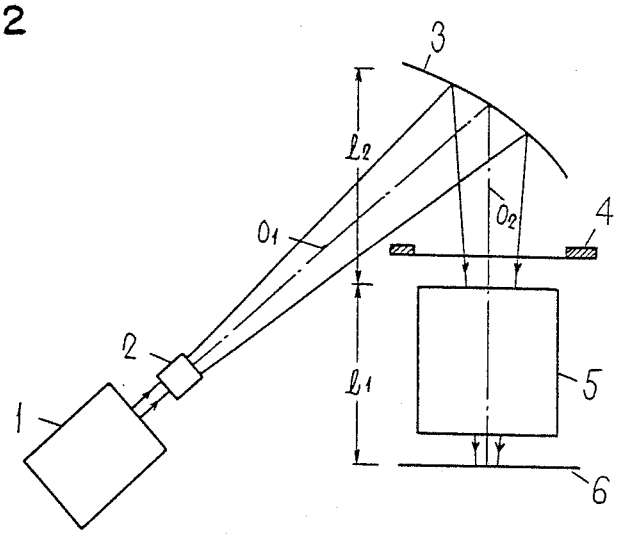
FIG. 2 is an schematic structural drawing of an essential part of another of the embodiments, of this invention.

FIG. 2 shows an example in which a relatively heavy excimer light source 1, is oriented obliquely upward, and is disposed at a lower of the apparatus so that the intersecting angle of optical axes $O_1$ and $O_2$ is acute, and in which the center of gravity of the entire apparatus is relatively low, which is very effective for preventing vibration.

Figure 3:
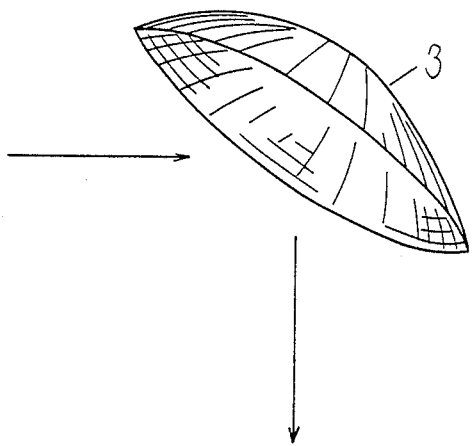
FIG. 3 is a perspective view of a concave spherical mirror.

FIG. 3 is a detailed drawing showing concave spherical mirror 3. As is clear from the drawing, the mirror 3 is shaped like a parabolic antenna, and its inner surface is the reflective plane.

Figure 4:
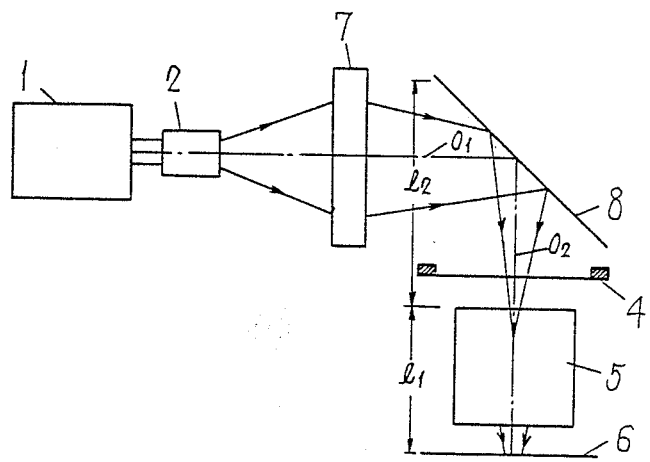
FIGS. 4, 5, 6 are schematic structural drawings of an essential part of conventional reduction projection exposure apparatus.
Figure 5:
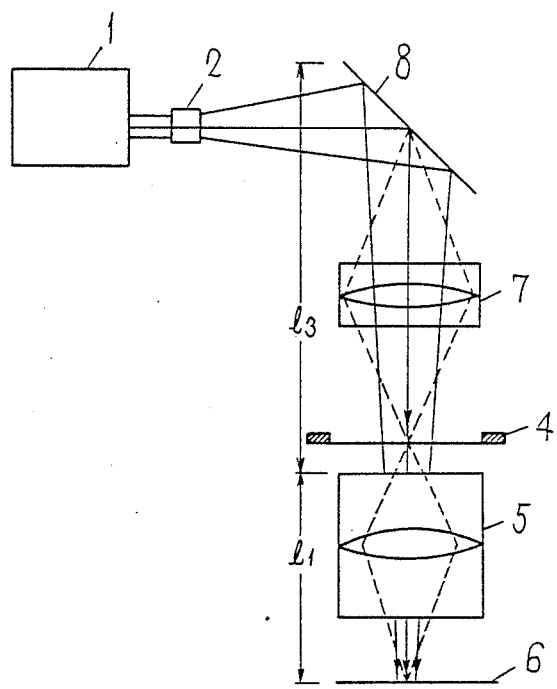

Referring now to FIG. 4, a second embodiment of this invention is described below. As the light source, for example, a KrF excimer laser beam source (oscillation wavelength 249 nm) 1 is used, and the light oscillated, excited and emitted from this light source is shaped and made uniform by an integrator 2. This integrator 2 has a function to enlarges the beam diameter and transmits the light. In addition, an illumination optical system, for example, a condenser lens 7, capable of irradiating the reticle effective region and transmitting the light to the incident pupil of the reduction projection lens 5 is disposed next to the integrator 2. By disposing a flat mirror 8 so that the optical path $O_2$ is vertical, the pattern of the reticle 4 is exposed on the wafer (semiconductor substrate) 6 through the lens 5. In this embodiment, the mirror 8 is disposed so that the optical axes $O_1$ and $O_2$ form a right angle, but by varying the angle of inclination of flat mirror 8, the length of the optical axis $O_1+O_2$ may be set freely.

Furthermore, the reflection plane of the flat mirror 8 is coated with a multilayer film made of aluminum film and dielectric film exhibiting high reflectivity. With this construction, the efficiency of reflectivity is over 99%.

In this optical system shown in FIG. 4, too, since the conventional condenser lens is omitted, the apparatus height $l_1+l_2$ is as low as 1.5 meters.

When the overall height $l_1+l_2$ of the apparatus is relatively low, deviation of optical axis $O_2$ due to vibration is limited, and the performance is very high when the apparatus is used as the exposure apparatus of the submicron pattern type. When exposing an ultrafine pattern of about 0.5 μm on the resist of the wafer, the resolution deteriorates if the optical axis $O_2$ is deviated only several microns. Therefore, in this apparatus, the reduction of the height by scores of centimeters is very useful for forming ultrafine exposure patterns because the deviation of the optical axis hardly occurs.

Thus, in the excimer laser exposure apparatus according to this invention, that is, by disposing the concave spherical mirror between the excimer laser optical system and reticle, or by disposing a flat mirror between the illumination optical system of an excimer laser optical system and the reticle, the conventional condenser lens is not necessary, and the apparatus height can be relatively low, and the ease and degree of freedom in designing a compact and highly precise excimer exposure apparatus and optical system is increased. The present invention is also very effective for preventing vibration, and facilitates extremely excellent effects when exposing and forming ultrafine patterns on the water comprising a semiconductor device.

Figure 6:
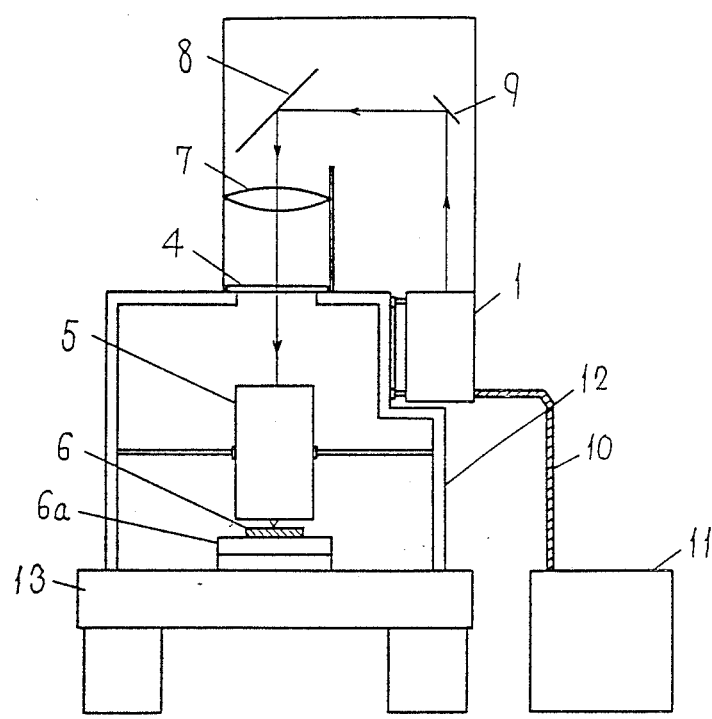

Furthermore, in an optical system using exposure light having a relatively short wavelength such as ArF (192 nm), since the reflective lens can be omitted, for example, the condenser lens in the illumination optical system in FIG. 6 can be omitted and the power loss can be kept to a minimum.

Moreover, according to this invention, in not only an exposure apparatus using an excimer laser light source, but also in a reduction projection exposure apparatus using ultraviolet rays such as the g-line and i-line of a conventional high pressure mercury lamp, similar effects are expected henceforth if the lens opening degree is enlarged and the lens length is increased.

Furthermore, since the optical path length can be shortened, power loss in the atmosphere far ultraviolet rays, in particular, is suppressed, so that the energy can be utilized effectively.

While specific embodiments of the invention have been illustrated and described herein, it is realized that modifications and changes will become apparent to those skilled in the art. It is therefore to be understood that the appended claims are intended to cover all modifications and changes as fall within the true spirit and scope of the invention.

We claim:

1. An exposure apparatus for exposing a wafer to a pattern of light, said apparatus comprising:
    an exposure light source for emitting light, the emitted light traveling along an optical path to the wafer;
    a wafer stage for supporting the wafer;
    a reticle stage for supporting a reticle in said optical path between said exposure light source and said wafer stage;
    a reduction projection lens disposed in said optical path between said exposure light source said wafer stage and through which the light passes before passing to the wafer; and
    a concave spherical reflection mirror disposed in said optical path between said reticle stage and said exposure lighrt source for reflecting the light emitted by said light source through both the reticle supported by said reticle stage and said reduction projection lens along said optical path to the wafer supported by said wafer stage,
    said reflection mirror having a concave spherical reflection surface at which the light is reflected, said reflection surface comprising a multilayer film including aluminum film and dielective film exhibiting a high degree of reflectivity.

2. An exposure apparatus for exposing a wafer to a pattern of light, said apparatus comprising:
    an exposure light source for emitting light, the emitted light traveling along an optical path to the wafer;
    a flat reflection mirror disposed in said optical path between said reticle stage and said exposure light source for reflecting the light emitted by said light source through both the reticle supported by said reticle stage and said reduction projection lens along said optical path to the wafer supported by said wafer stage;
    said reflection mirror having a flat reflection surface at wnhich the light is reflected, said reflection surface comprising a multilayer film including aluminum film and dielective film exhibiting a high degree of reflectivity.

3. An exposure apparatus for exposing a wafer to a pattern of light, said apparatus comprising:
    an exposure light source for emitting light, the emitted light traveling along an optical path to the wafer;
    a wafer stage for supporting the wafer;
    a reticle stage for supporting a reticle in said optical path between said exposure light source and said wafer stage;
    a reduction projection lens disposed in said optical path between said reticle stage and said wafer stage and through which the light passes before passing to the wafer, said lens having an incident pupil; and
    a concave spherical reflection mirror disposed in said optical path between said reticle stage and said exposure light source for reflecting the light emitted by said light source along said optical path through the reticle supported by said reticle stage and then through the incident pupil of said reduction projection lens to the wafer supported by said wafer stage.

4. An exposure apparatus as claimed in claim 3, wherein said exposure light source is one of an excimer laser and a high pressure mercury lamp.

5. An exposure apparatus for exposing a wafer to a pattern of light, said apparatus comprising:
    an illumination optical system including an exposure light source for emitting light that travels along a first optical path, an integrator disposed in said first optical path for integrating the emitted light, and a condenser lens through which the emitted light travels along said first optical path;
    a wafer stage for supporting the wafer;
    a reticle stage for supporting a reticle in a second optical path;
    a reduction projection lens disposed in said second optical path; and
    a flat reflection mirror disposed between said illumination optical system and said reticle stage for reflecting the emitted light traveling along said first optical path along said second optical path through both the reticle supported by said reticle stage and said reduction projection lens and toward the wafer supported by said wafer stage,
    said first optical path and said second optical path intersecting at a right angle.

6. An exposure apparatus as claimed in claim 5, wherein said exposure light source is one of an excimer laser and a high pressure mercury lamp.

* * * * *